(12) United States Patent
Lee et al.

(10) Patent No.: US 8,173,483 B2
(45) Date of Patent: May 8, 2012

(54) METHOD OF MANUFACTURING SOLAR CELL

(75) Inventors: Jeong-Woo Lee, Paju-si (KR); Seong-Kee Park, Gyeonggi-do (KR); Kyung-Jin Shim, Paju-si (KR); Tae-Youn Kim, Seoul (KR); Won-Seo Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 196 days.

(21) Appl. No.: 12/654,493

(22) Filed: Dec. 22, 2009

(65) Prior Publication Data

US 2010/0267193 A1    Oct. 21, 2010

(30) Foreign Application Priority Data

Apr. 17, 2009   (KR) .................. 10-2009-0033806

(51) Int. Cl.
*H01L 31/0376* (2006.01)

(52) U.S. Cl. ...... 438/96; 438/48; 438/795; 257/E31.047

(58) Field of Classification Search .............. 438/96, 438/795; 257/E31.047
See application file for complete search history.

(56) References Cited

U.S. PATENT DOCUMENTS

| | | | | |
|---|---|---|---|---|
| 5,413,959 | A * | 5/1995 | Yamamoto et al. | 438/98 |
| 5,589,403 | A * | 12/1996 | Toyama et al. | 438/71 |
| 5,810,945 | A * | 9/1998 | Stutzmann et al. | 438/96 |
| 6,509,204 | B2 * | 1/2003 | Campbell | 438/97 |
| 2008/0176398 | A1 * | 7/2008 | Jain et al. | 438/674 |
| 2009/0239326 | A1 * | 9/2009 | Myong | 438/57 |
| 2010/0227430 | A1 * | 9/2010 | Pinchart et al. | 438/96 |

* cited by examiner

*Primary Examiner* — Angel Roman
(74) *Attorney, Agent, or Firm* — McKenna Long & Aldridge LLP (57) ABSTRACT

A method of manufacturing a solar cell includes forming a transparent conductive layer on a substrate by depositing a transparent conductive oxide under room temperature, crystallizing the transparent conductive layer by irradiating a laser beam to the transparent conductive layer using a first laser; selectively etching the crystallized transparent conductive layer to form embossed and depressed patterns at a surface of the transparent conductive layer; forming transparent electrodes in unit cells by patterning the transparent conductive layer having the embossed and depressed patterns; forming a p-n junction semiconductor layer on the transparent electrodes and patterning the p-n junction semiconductor layer; and forming rear electrodes on the patterned p-n junction semiconductor layer by forming a metallic material layer and patterning the metallic material layer, the rear electrodes corresponding to the unit cells.

13 Claims, 6 Drawing Sheets

METHOD OF MANUFACTURING SOLAR CELL

This application claims the benefit of Korean Patent Application No. 10-2009-0033806, filed on Apr. 17, 2009, which is hereby incorporated by reference in its entirety.

BACKGROUND OF THE INVENTION

1. Field of the Invention

The present invention relates to a solar cell, and more particularly, to a method of manufacturing a solar cell that improves electro-optical properties and maximizes efficiency of the solar cell.

2. Discussion of the Related Art

A solar cell is a semiconductor device that converts solar energy into electric energy. The solar cell includes a junction formed by joining a p-type semiconductor and an n-type semiconductor together in contact and has a basic structure of a diode.

In general, a solar cell includes a structure of a p-n junction semiconductor layer, in which a p-type semiconductor layer and an n-type semiconductor layer are disposed between opposite electrodes.

For photovoltaic energy conversion of a solar cell, electrons exist asymmetrically in the structure of the p-n junction semiconductor layer. Namely, in the structure of the p-n junction semiconductor layer, the n-type semiconductor layer has high electron density and low hole density, and the p-type semiconductor layer has low electron density and high hole density. Therefore, in a thermal equilibrium state, imbalance of electric charges is caused by diffusion due to different densities of carriers in the p-n junction semiconductor layer. According to this, an electric field is induced, and there is no more diffusion of the carries. At this time, when light having a larger energy than a band gap energy, which is an energy difference between a conduction band and a valence band, is irradiated to the p-n junction semiconductor layer, electrons receiving the energy are excited from the valence band to the conduction band, and holes are generated in the valence band. The electrons excited to the conduction band freely move. The free electrons and the holes generated as mentioned above may be referred to as excess carriers, and the excess carriers are diffused by the difference of the density in the valence band or the conduction band. Here, the excess carriers, that is, the excited electrodes in the p-type semiconductor layer and the holes generated in the n-type semiconductor layer, are defined as minority carriers, while the carriers in the p-type and n-type semiconductor layers before joining, that is, the holes in the p-type semiconductor layer and the electrons in the n-type semiconductor layer, are defined as majority carriers. Flow of the majority carriers is blocked by an energy barrier due to the electric field. However, the electrons, the minority carriers in the p-type semiconductor layer, can move to the n-type semiconductor layer. The diffusion of the minority carriers causes a potential drop in the p-n junction semiconductor layer. When the p-n junction semiconductor layer is connected to an outer circuit, this can be used as an electric cell due to an electromotive force generated at both ends of the p-n junction semiconductor layer.

Accordingly, a solar cell further includes a transparent electrode and a rear electrode at outer surfaces of the p-n junction semiconductor layer. The transparent electrode has an uneven surface so that light from an external light source is efficiently provided to the p-n junction semiconductor layer.

FIGS. 1A to 1F are views of illustrating a solar cell in steps of a method of manufacturing the same according to the related art.

Figure 1A:
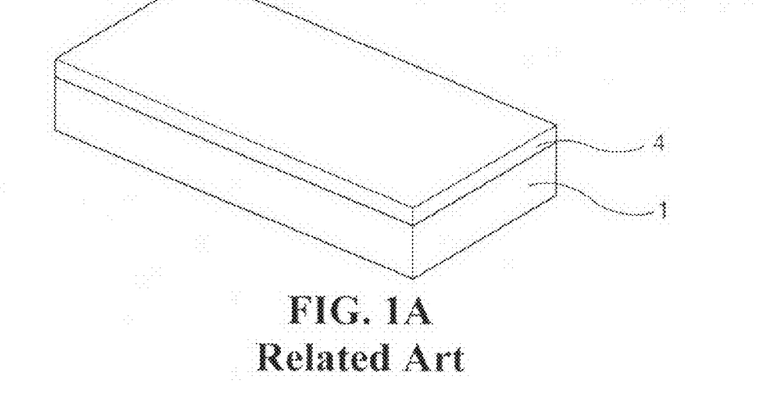
FIGS. 1A to 1F are views of illustrating a solar cell in steps of a method of manufacturing the same according to the related art.

In FIG. 1A, a transparent conductive layer 4 is formed on a substantially entire surface of a transparent insulating substrate 1 by depositing a transparent conductive oxide (TCO) using a sputtering apparatus (not shown) under temperature of 300 to 600 degrees of Celsius. The transparent conductive layer 4 has an even surface. At this time, the deposition of the transparent conducive oxide by a sputtering method under high temperature is accompanied with partial crystallization, and the transparent conductive layer 4 includes randomly micro-crystallized portions and amorphous portions between the crystallized portions.

Figure 1B:
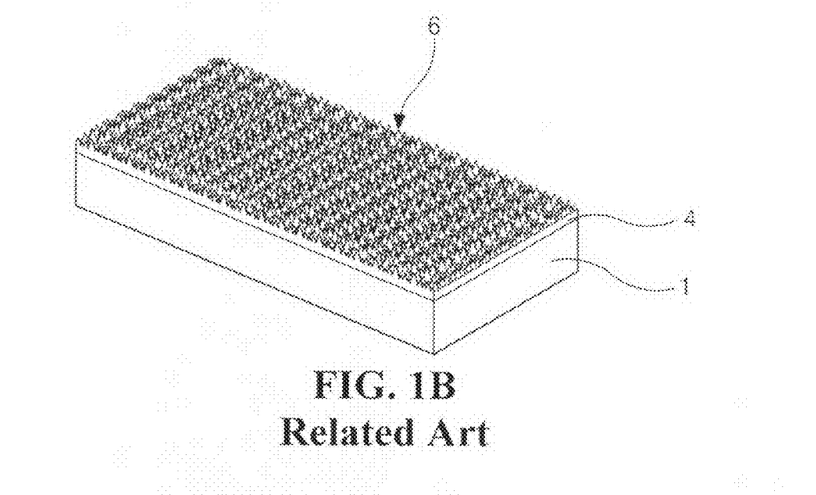

In FIG. 1B, embossed and depressed patterns 6 are formed at the surface of the transparent conductive layer 4 by dipping the substrate 1 including the transparent conductive layer 4 into an etching bath (not shown) filled with etchant, which reacts with the transparent conductive oxide, or by spraying etchant onto the transparent conductive layer 4. Here, time for exposing the transparent conductive layer 4 to the etchant is properly controlled, and the transparent conductive layer 4 is not completely etched. Some parts of the surface of the transparent conductive layer 4 are etched, and other parts of the surface of the transparent conductive layer 4 are not etched, whereby the embossed and depressed patterns 6 are formed at the surface of the transparent conductive layer 4. Moreover, the embossed and depressed patterns 6 are more embossed or depressed due to the difference between the crystallized portions and the amorphous portions.

Figure 1C:
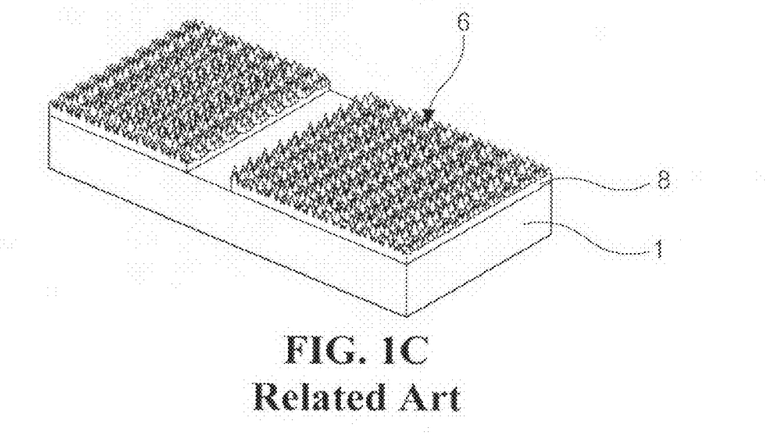

In FIG. 1C, the transparent conductive layer 4 of FIG. 1B is patterned by irradiating a laser beam to the transparent conductive layer 4 including the embossed and depressed patterns 6 using a laser (not shown), and thus a transparent electrode 8 is formed in each unit cell. The transparent electrode 8 in one unit cell is spaced apart from one in a next unit cell.

Figure 1D:
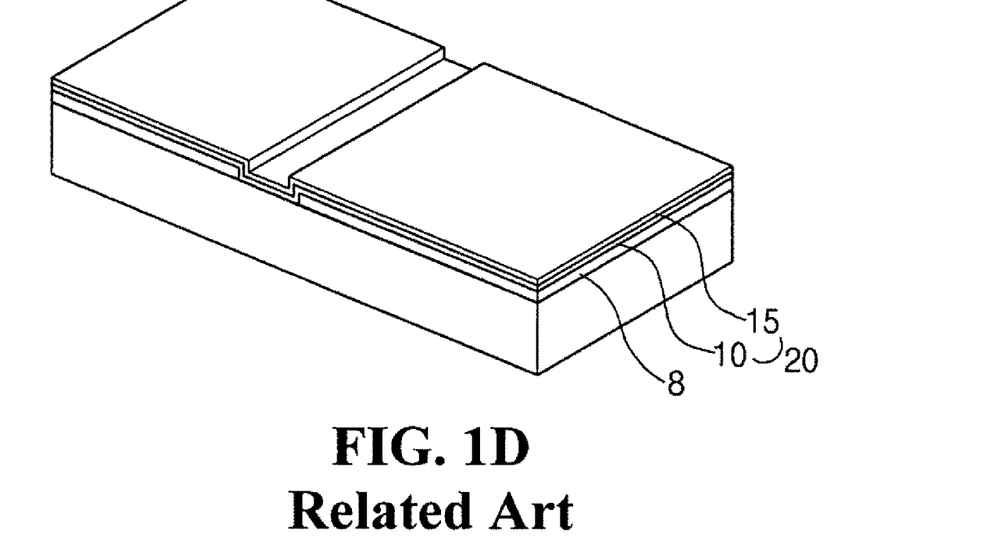

In FIG. 1D, an n-type semiconductor layer 10 is formed on a substantially entire surface of the substrate 1 including the transparent electrodes 8 by depositing a semiconductor material with n-type impurities. Subsequently, a p-type semiconductor layer 15 is formed on the n-type semiconductor layer 10 by depositing a semiconductor material with p-type impurities. The n-type semiconductor layer 10 and the p-type semiconductor layer 15 constitute a p-n junction semiconductor layer 20.

Figure 1E:
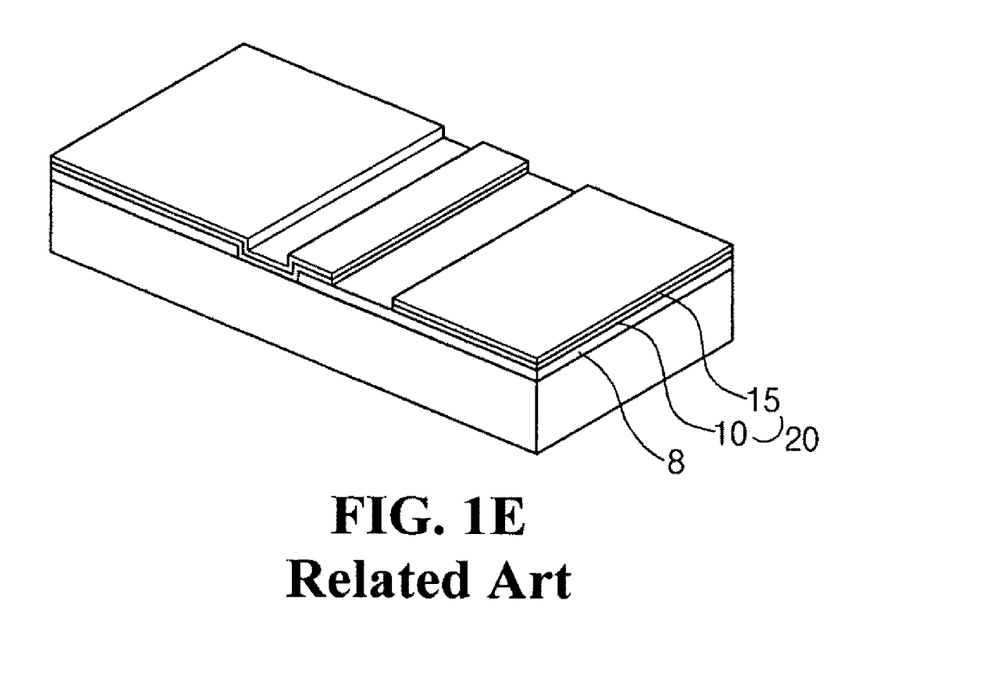

In FIG. 1E, the p-n junction semiconductor layer 20 is patterned by irradiating a laser beam to the p-n junction semiconductor layer 20 using a laser (not shown).

Figure 1F:
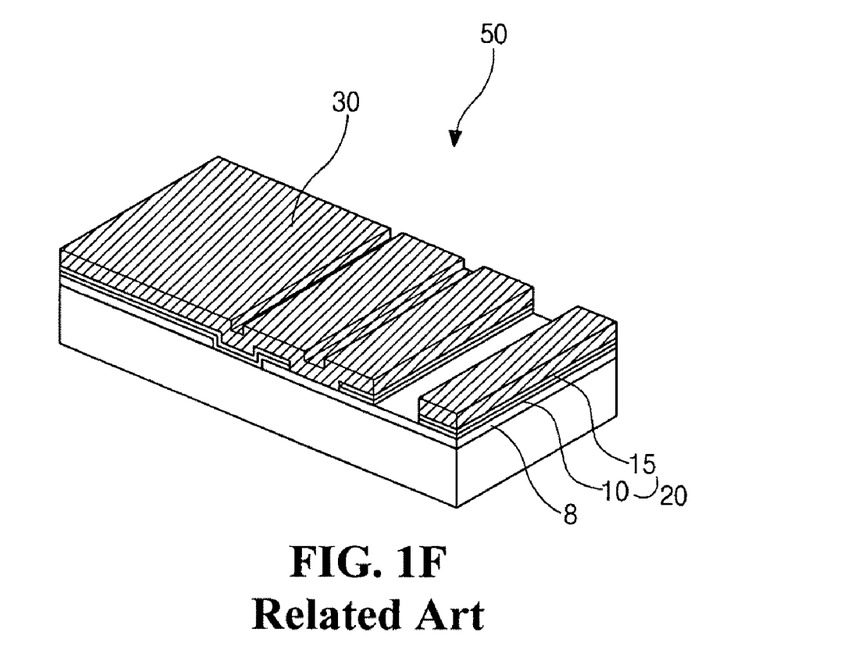

In FIG. 1F, a rear electrode 30 is formed on the patterned p-n junction semiconductor layer 20 by depositing a metallic material all over the surface and patterning it. Accordingly, a solar cell 50 is completed.

However, in the solar cell 50, the embossed and depressed patterns 6 are small and irregular.

Figure 2:
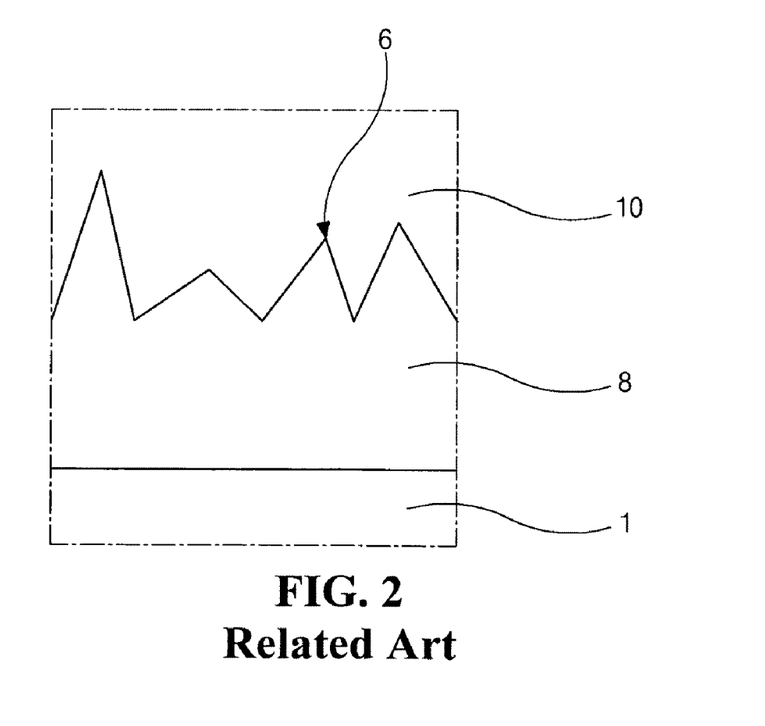
FIG. 2 is a cross-sectional view of enlarging part of a related art solar cell.

FIG. 2 is a cross-sectional view of enlarging part of a related art solar cell. In FIG. 2, the embossed and depressed patterns 6 are formed by etching the transparent conductive layer 4 using different etch rates of the crystallized portions and the amorphous portions, which are formed when the transparent conductive material is deposited. Here, the crystallized portions are randomly disposed, and the micro-crystallization is performed. Therefore, the embossed patterns 6 are very small, and angles of sides of the embossed patterns 6 with respect to the substrate 1 are irregular. According to this, incident light through a surface of the substrate 1 is not effectively scattered, and the efficiency of the solar cell 50 is lowered.

SUMMARY OF THE INVENTION

Accordingly, the present invention is directed to a method of manufacturing a solar cell that substantially obviate one or more of the problems due to limitations and disadvantages of the related art.

An object of the present invention is to provide method of manufacturing a solar cell that efficiently absorbs external light and maximize the efficiency of the solar cell.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a solar cell includes steps of forming a transparent conductive layer on a substrate by depositing a transparent conductive oxide under room temperature, crystallizing the transparent conductive layer by irradiating a laser beam to the transparent conductive layer using a first laser; selectively etching the crystallized transparent conductive layer to form embossed and depressed patterns at a surface of the transparent conductive layer; forming transparent electrodes in unit cells by patterning the transparent conductive layer having the embossed and depressed patterns; forming a p-n junction semiconductor layer on the transparent electrodes and patterning the p-n junction semiconductor layer; and forming rear electrodes on the patterned p-n junction semiconductor layer by forming a metallic material layer and patterning the metallic material layer, the rear electrodes corresponding to the unit cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to an embodiment of the present invention, an example of which is illustrated in the accompanying drawings.

FIGS. 3A to 3G are views of illustrating a solar cell in steps of a method of manufacturing the same according to an exemplary embodiment of the present invention.

Figure 3A:
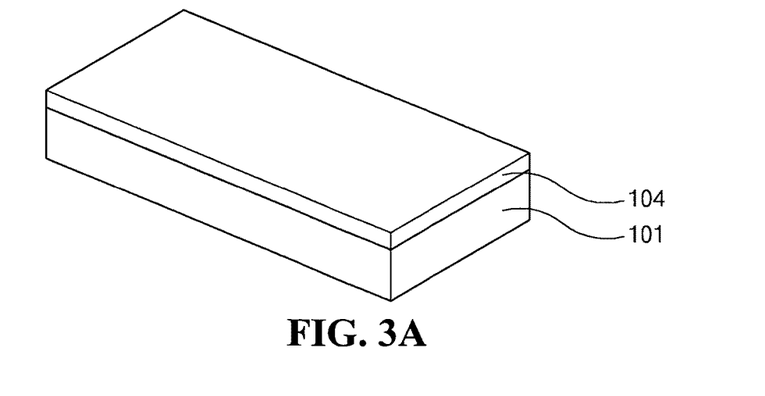
FIGS. 3A to 3G are views of illustrating a solar cell in steps of a method of manufacturing the same according to an exemplary embodiment of the present invention.

In FIG. 3A, a transparent conductive layer 104 is formed on a substantially entire surface of a transparent insulating substrate 101 by depositing a transparent conductive oxide (TCO) using a sputtering apparatus (not shown) under room temperature. The transparent conductive layer 104 has an even surface. The transparent conductive oxide may include SnO:X or ZnO:X, wherein X is a metallic material such as lithium, magnesium, nickel, aluminum, etc. The substrate 101 may be a glass substrate or a plastic substrate.

Namely, while, in the related art, the transparent conductive layer is formed under high temperature of 300 to 600 degrees of Celsius such that the surface of the transparent conductive layer has the crystallized portions and amorphous portions, the transparent conductive layer 104 is formed by a sputtering method under room temperature in the present invention. This is why a surface of the transparent conductive layer 104 will be crystallized later.

Figure 3B:
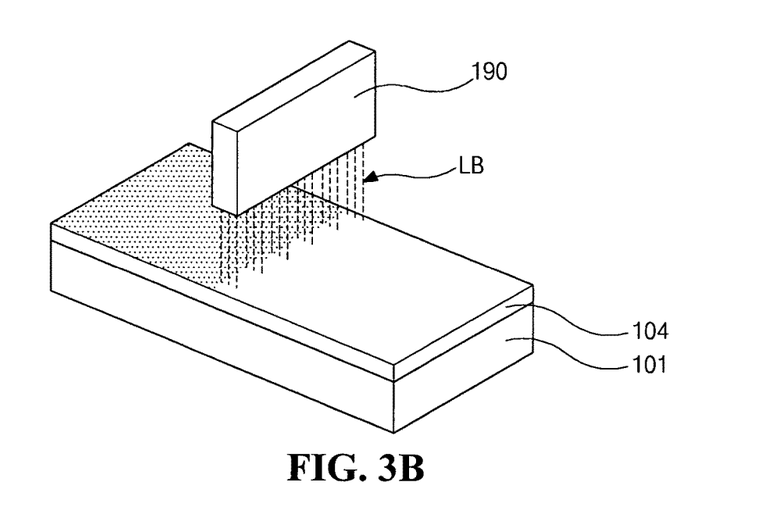

In FIG. 3B, a laser 190 is disposed over the transparent conductive layer 104, and a laser beam LB is irradiated onto a surface of the transparent conductive layer 104 under room temperature. The transparent conductive layer 104 is melted by a predetermined thickness from the surface thereof and then solidified, and the transparent conductive layer 104 is partially crystallized. Here, the laser 190, beneficially, may be an IR (infra red) laser to instantly melt a transparent conductive material. The laser beam LB of the IR laser 190 may have a wavelength of 1064 nm, and the IR laser 190 may have a power of 5 W to 10 W and a frequency of 40 KHz to 60 KHz. If the power of the IR laser 190 is larger than 10 W, the laser beam LB may have too strong power per unit area, and the transparent conductive layer 104 may be vaporized and removed before crystallization of the surface of the transparent conductive layer 104.

Like this, the laser beam LB having optimized conditions is irradiated to the surface of the transparent conductive layer 104, and the surface of the transparent conductive layer 104 is crystallized to form grains (not shown). The grains may have uniform sizes all over the surface of the transparent conductive layer 104.

Figure 3C:
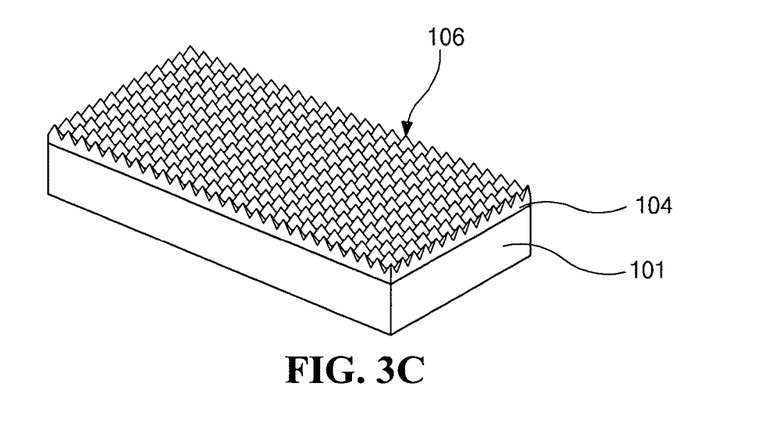

In FIG. 3C, embossed and depressed patterns 106 are formed at the surface of the transparent conductive layer 104 by dipping the substrate 101 including the transparent conductive layer 104 with the crystallized surface into an etching bath (not shown) filled with etchant, which reacts with the transparent conductive oxide, or by spraying etchant onto the crystallized surface of the transparent conductive layer 104. Here, time for exposing the transparent conductive layer 104 to the etchant is properly controlled, and the transparent conductive layer 104 is not completely etched. Some parts of the surface of the transparent conductive layer 104 are etched, and other parts of the surface of the transparent conductive layer 104 are not etched, whereby the embossed and depressed patterns 106 are formed at the surface of the transparent conductive layer 104. An etch rate of a boundary between the grains is different from that of the grains. The boundaries are faster etched than the grains. Etching gradually proceeds toward edges of each grain on a basis of a center of the grain, and the embossed patterns 106 are formed in substantially respective grains having uniform sizes. The embossed patterns 106 may have uniform sizes.

Figure 4:
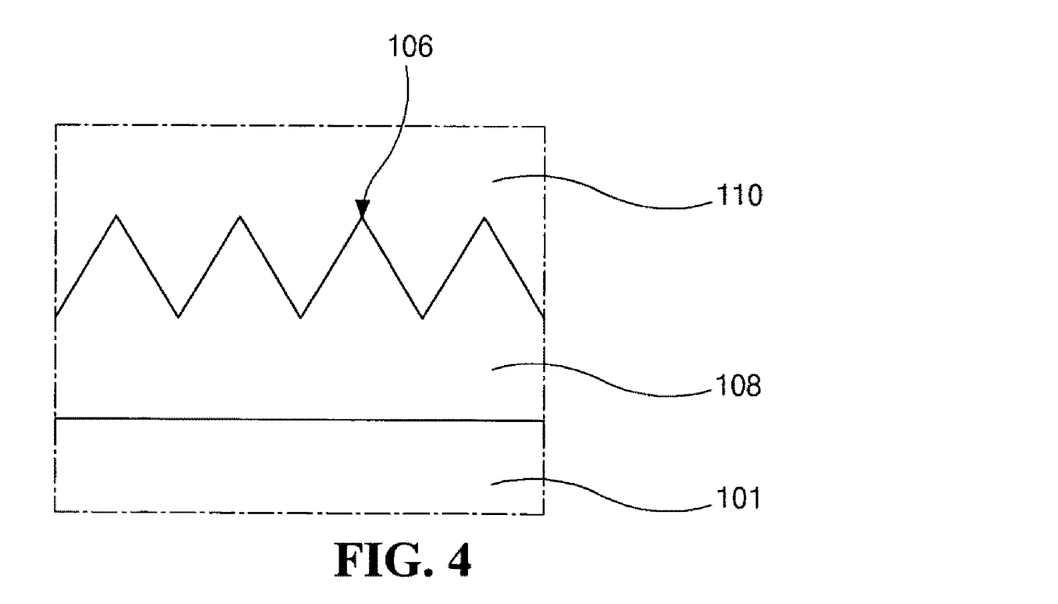
FIG. 4 is a cross-sectional view of enlarging part of a solar cell according to the present invention.

Referring to FIG. 4, which is a cross-sectional view of enlarging part of the solar cell according to the present invention, the embossed patterns are large and uniform as compared with the embossed patterns 6 of FIG. 2. In addition, angles of sides of the embossed patterns 106 with respect to the substrate 101 are uniform. Accordingly, light is efficiently prevented from being totally reflected. Light-scattering are increased, and light-absorbing is raised.

Meanwhile, heights of the embossed patterns 106 and the angles of the sides of the embossed patterns 106 with respect to the substrate 101 can be adjusted by controlling the time for exposing the transparent conductive layer 104 to the etchant. In the related art, since the transparent conductive layer is formed under high temperature and includes the micro-crystallized portions and the amorphous portions, the embossed patterns formed by etching the micro-crystallized portions and the amorphous portions have various sizes. Accordingly, it is difficult to adjust the angles of the sides of the embossed patterns with respect to the substrate by controlling the etching time. However, in the present invention, since the grains crystallized by the IR laser 190 of FIG. 3B have uniform sizes, it is possible to adjust the angles of the sides of the embossed patterns 106 with respect to the substrate 101 by controlling the etching time.

Figure 3D:
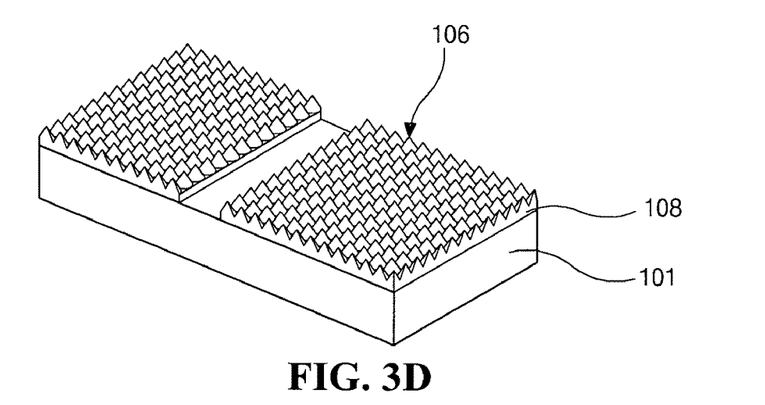

In FIG. 3D, the transparent conductive layer 104 of FIG. 3C is partially removed and patterned by irradiating a laser beam to the transparent conductive layer 104 including the embossed and depressed patterns 106 using a laser (not shown), and thus a transparent electrode 108 is formed in each unit cell. The transparent electrode 108 in one unit cell is spaced apart from one in a next unit cell. Here, the laser may be an IR laser, and in this case, the IR laser may have a power of 12 W to 20 W. When the laser has a power less than 12 W, more particularly, less than 10 W, the transparent conductive layer 104 may be melted and crystallized, and the transparent conductive layer 104 may not be removed.

Figure 3E:
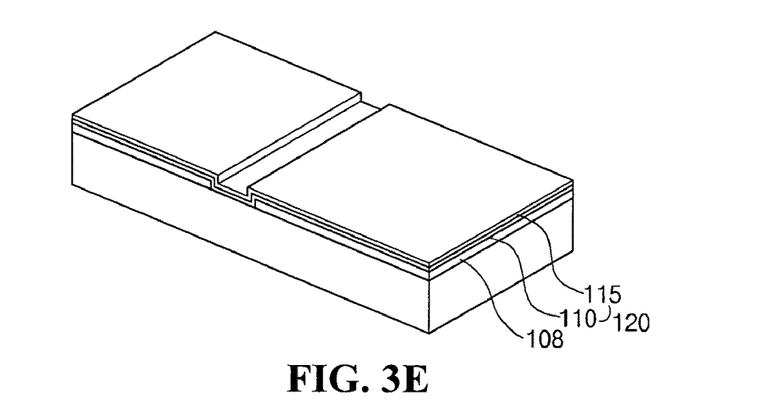

In FIG. 3E, an n-type semiconductor layer 110 is formed on a substantially entire surface of the substrate 101 including the transparent electrodes 108 by depositing a semiconductor material with n-type impurities. Subsequently, a p-type semiconductor layer 115 is formed on the n-type semiconductor layer 110 by depositing a semiconductor material with p-type impurities. The n-type semiconductor layer 110 and the p-type semiconductor layer 115 constitute a p-n junction semiconductor layer 120. At this time, an intrinsic amorphous semiconductor layer, for example, an intrinsic amorphous silicon layer, may be further formed between the n-type semiconductor layer 110 and the p-type semiconductor layer 115.

Figure 3F:
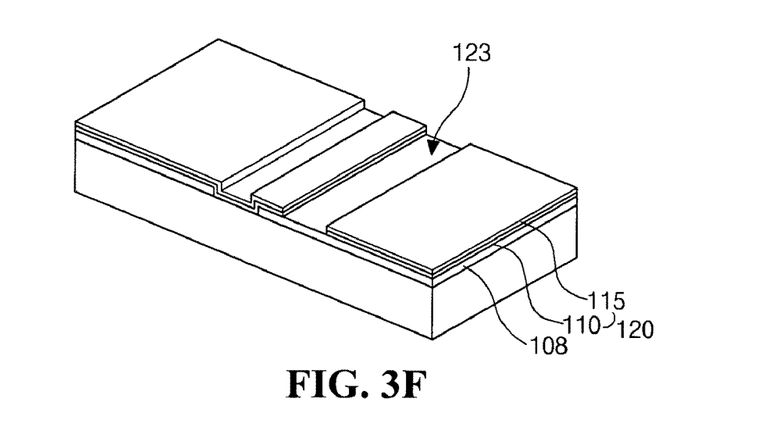

In FIG. 3F, the p-n junction semiconductor layer 120 is patterned by irradiating a laser beam (not shown) to the p-n junction semiconductor layer 120 using a laser (not shown). The patterned p-n junction semiconductor layer 120 has ends that are not coincided with ends of the transparent electrode 108, and the transparent electrode 108 is exposed between adjacent p-n junction semiconductor layers 120. Namely, boundaries of the transparent electrode 108 do not overlap and differ from boundaries of the p-n junction semiconductor layer 120. The laser for patterning the p-n junction semiconductor layer 120 has a larger power than the laser for patterning the transparent conductive layer 104. The laser beam of the laser for patterning the p-n junction semiconductor layer 120 may have a wavelength of 190 nm to 308 nm. The laser for patterning the p-n junction semiconductor layer 120 may be an Excimer laser or an Nd-YAG laser. The laser beam of the Excimer laser or the Nd-YAG having a wavelength of 190 nm to 308 nm may have no influence on the transparent electrode 108 because the transparent electrode 108 absorbs a laser beam having a different wavelength.

Figure 3G:
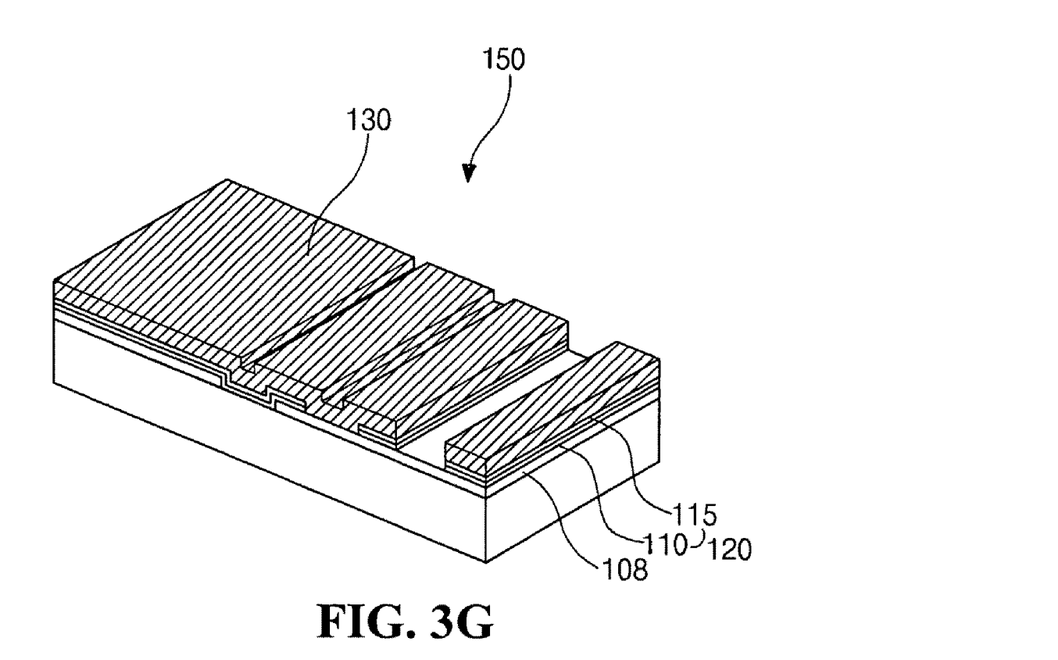

In FIG. 3G, a rear electrode 130 is formed on the patterned p-n junction semiconductor layer 120 by depositing a metallic material all over the surface and patterning it. The metallic material may be aluminum or aluminum alloy having relatively high reflectance. Accordingly, a solar cell 50 is completed.

Here, the deposited metallic material may be patterned by irradiating a laser beam or by performing a photolithographic process, which includes applying photoresist to a thin film, exposing the photoresist to light, developing the light-exposed photoresist and etching the thin film.

In the meantime, when the rear electrode 140 is patterned, the p-n junction semiconductor layer 120 is also patterned, and the transparent electrode 108 is exposed. The rear electrode 140 is patterned as shown in the figure so that electromotive forces, which are generated from external light in the unit cells, are connected in series. The solar cell 150 includes many unit cells, and an electromotive force in each unit cell is very low and is not enough to be used for an electronic device. Therefore, the rear electrode 130 of one unit cell is connected to the transparent electrode 108 of a next unit cell. The electromotive forces of the unit cells are connected in series, and a relatively high voltage can be used.

In the solar cell of the present invention, since the embossed and depressed patterns of the transparent electrode have uniform width and large sizes as compared to the related art, total reflection of incident light is effectively prevented to thereby maximize quantity of light incident on the p-n junction semiconductor layer. Furthermore, an ability of absorbing light is maximized, and efficiency of the solar cell is improved. In addition, since the transparent electrode has the improved transmittance and inner and contact resistances due to the crystallized surface thereof, the efficiency of the solar cell is further increased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a solar cell, comprising:
   forming a transparent conductive layer on a substrate by depositing a transparent conductive oxide under room temperature;
   crystallizing the transparent conductive layer by irradiating a laser beam to the transparent conductive layer using a first laser;
   selectively etching the crystallized transparent conductive layer to form embossed and depressed patterns at a surface of the transparent conductive layer;
   forming transparent electrodes in unit cells by patterning the transparent conductive layer having the embossed and depressed patterns;
   forming a p-n junction semiconductor layer on the transparent electrodes and patterning the p-n junction semiconductor layer; and
   forming rear electrodes on the patterned p-n junction semiconductor layer by forming a metallic material layer and patterning the metallic material layer, the rear electrodes corresponding to the unit cells.

2. The method according to claim 1, wherein the transparent conductive oxide includes one of SnO:X and ZnO:X, wherein X is a metallic material.

3. The method according to claim 1, wherein the first laser is an infra red laser that has a frequency of 40 KHz to 60 KHz, a power of 5 W to 10 W and generates a laser beam having a wavelength of 1064 nm.

4. The method according to claim 1, wherein patterning the transparent conductive layer includes irradiating a laser beam using a second laser that has a power larger than 12 W.

5. The method according to claim 4, wherein the second laser is an infrared laser.

6. The method according to claim 4, wherein patterning the p-n junction semiconductor layer includes irradiating a laser beam using a third laser that has a larger power than the second laser.

7. The method according to claim 6, wherein the third laser is one of an Excimer laser and a Nd-YAG laser that generates a laser beam having a wavelength of 190 nm to 308 nm.

8. The method according to claim 1, wherein patterning the p-n junction semiconductor layer includes exposing the transparent electrodes between adjacent patterned p-n junction semiconductor layers.

9. The method according to claim 8, wherein patterning the metallic material layer includes selectively removing the patterned p-n junction semiconductor layer and exposing the transparent electrodes between adjacent rear electrodes.

10. The method according to claim 9, wherein the rear electrode in one unit cell contacts the transparent electrode in a next unit cell.

11. The method according to claim 1, wherein forming the p-n junction semiconductor layer includes forming a p-type semiconductor layer on the transparent electrodes and forming an n-type semiconductor layer on the p-type semiconductor layer.

12. The method according to claim 11, wherein forming the p-n junction semiconductor layer further includes forming an intrinsic amorphous semiconductor layer between the p-type semiconductor layer and the n-type semiconductor layer.

13. The method according to claim 1, wherein patterning the metallic material layer includes one of irradiating a laser beam and performing a photolithographic process, which includes applying photoresist to a thin film, exposing the photoresist to light, developing the light-exposed photoresist and etching the thin film steps.

* * * * *